United States Patent
Street

(10) Patent No.: US 7,811,638 B2
(45) Date of Patent: Oct. 12, 2010

(54) MULTI-PRINTED ETCH MASK PROCESS TO PATTERN FEATURES

(75) Inventor: Robert A. Street, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 983 days.

(21) Appl. No.: 11/315,713

(22) Filed: Dec. 22, 2005

(65) Prior Publication Data

US 2007/0145002 A1 Jun. 28, 2007

(51) Int. Cl.
B05D 1/32 (2006.01)
(52) U.S. Cl. .................... 427/466; 427/467; 427/511
(58) Field of Classification Search ............ 427/466, 427/467, 511
See application file for complete search history.

(56) References Cited

U.S. PATENT DOCUMENTS

| 6,872,320 | B2 | 3/2005 | Wong et al. |
| 6,972,261 | B2* | 12/2005 | Wong et al. .......... 438/706 |
| 7,061,570 | B2* | 6/2006 | Imai .................. 349/187 |
| 7,125,495 | B2 | 10/2006 | Street et al. |
| 2004/0002225 | A1* | 1/2004 | Wong et al. .......... 438/745 |
| 2005/0026410 | A1* | 2/2005 | Yamazaki et al. ..... 438/597 |

* cited by examiner

Primary Examiner—Binh X Tran
(74) Attorney, Agent, or Firm—Fay Sharpe LLP

(57) ABSTRACT

A method for patterning fine features using multiple jet-printed etch masks includes forming an initial feature through a first jet-printed etch mask and re-shaping the initial feature through at least one additional jet-printed etch mask.

20 Claims, 5 Drawing Sheets

MULTI-PRINTED ETCH MASK PROCESS TO PATTERN FEATURES

This invention was made with Government support under 70NANB3H3029 awarded by NIST/Varian. The Government has certain rights in this invention.

BACKGROUND

The following relates to semiconductor fabrication. It finds particular application to forming features. More particularly, it is directed to forming features using jet-printing technology.

Traditionally, photolithography was commonly used to pattern features on semiconductors. However, jet-printing technology has become a viable alternative and can reduce costs by eliminating a need for photolithographic systems and/or equipment. With jet-printing (or digital lithography), a jet printer is used to produce a pattern using materials ejected from a print head. The printed pattern can either include various features such as electrodes or be a mask used for subsequent semiconductor processing steps such as etching, stripping, etc. The resulting masks are sometimes referred to as jet-printed etch masks.

A typical process employing jet-printed etch mask technology includes depositing a film to be patterned; jet printing a mask pattern on the film; etching the exposed area of the material; and stripping the mask. This results in relatively low-resolution features with a size limited to the printed drop size, which typically is about forty microns for conventional jet-printers. One approach to achieving smaller feature sizes (e.g., narrower widths) is to manufacture print heads with smaller print drop sizes. However, redesigning print heads can be costly and inefficient.

Piezoelectric jet print heads allow generation of lower droplet volumes. However, the small feature size desired for various fabrication processes is still difficult to achieve, for example, due to surface tension between the droplet and the wetted surface. Typically, complete wetting is needed to form a good contact in order to prevent undercutting of the printed mask. However, as the surface is wetted, the liquid droplet tends to spread out making it difficult to control feature size, which can results in undesirably large feature sizes. Decreasing wetting can result in unreliable patterning due to poor adhesion of the droplet to the substrate.

Thus, there is an unresolved need for improved jet-printing patterning techniques.

BRIEF DESCRIPTION

In one aspect, a method for patterning fine features using multiple jet-printed etch masks is illustrated. The method includes forming an initial feature through a first jet-printed etch mask and re-shaping the initial feature through at least one additional jet-printed etch mask.

DETAILED DESCRIPTION

Figure 1:
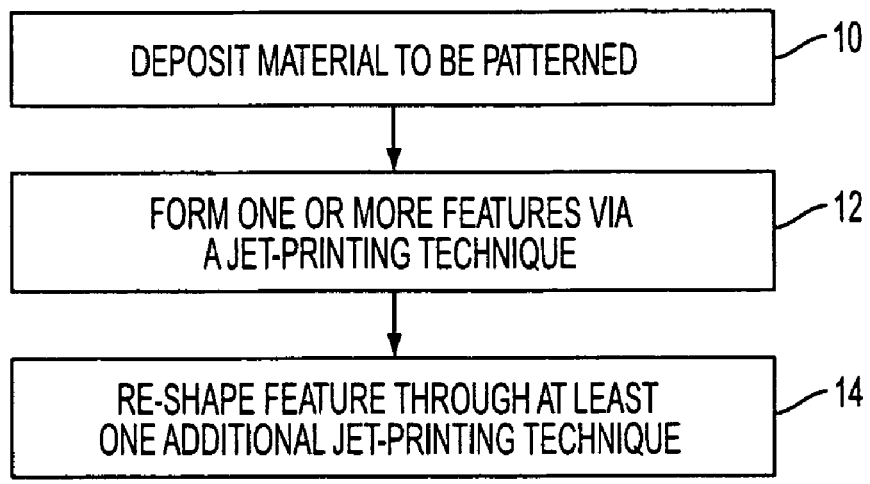
FIG. 1 illustrates an exemplary method for patterning fine features using multiple jet-printed etch masks.

With reference to FIG. 1, a method for patterning fine features using multiple jet-printed etch masks is illustrated. At reference numeral 10, a material is deposited on a substrate. Such material can be or include a metal and/or be a non-metal. At 12, one or more features are formed on the substrate using a jet-printing technique. For example, the one or more features can be patterned on the material via a jet-printed etch mask. After patterning, the exposed portions of the material can be etched. Subsequently, the mask can be stripped, exposing the features. Using a conventional jet printer technology, the features typically are relatively low-resolution features with width of about forty microns or greater.

At 14, the features are re-shaped using at least one additional jet-printing technique. For example, a second mask can be jet-printed over a portion of one or more of the features such that the second mask partially overlaps them. The second mask can be applied in a direction that is parallel, orthogonal, or at an arbitrary angle with respect to that of the first mask, depending on the desired shape of the final feature. In one instance, the second mask is used to narrow the features and, hence, increase their resolution. In this instance, the second mask can be jet-printed parallel to the features such that the second mask overlaps a portion of a width of the features. That is, at least one edge of the second mask is offset from a location where a corresponding edge of the first mask was positioned. The exposed portion of the features is then etched, and the second mask is subsequently stripped. The resulting features from the multiple jet printed etch masks are high resolution, narrow width features with widths of about forty microns or less.

The foregoing multi-jet-printed mask technique provides for creating finer features on substrates relative to using single mask jet-printing techniques. For example, a typical jet-printing technique using a conventional jet head results in a low-resolution feature with a width of about forty microns or larger. However, at these sizes, the drop placement typically is relatively accurate. For example, in one instance the drop placement accuracy for a forty micron drop may be about five microns. Thus, the placement of the multiple masks described above can be relatively accurate. This capability is leveraged to accurately position the feature on the substrate and then accurately re-size the feature to a smaller, higher resolution feature with a width of about forty microns or less. In one instance, the feature width can be reduced to about twenty microns. In another instance, the feature width can be reduced to about ten microns.

Figure 2:
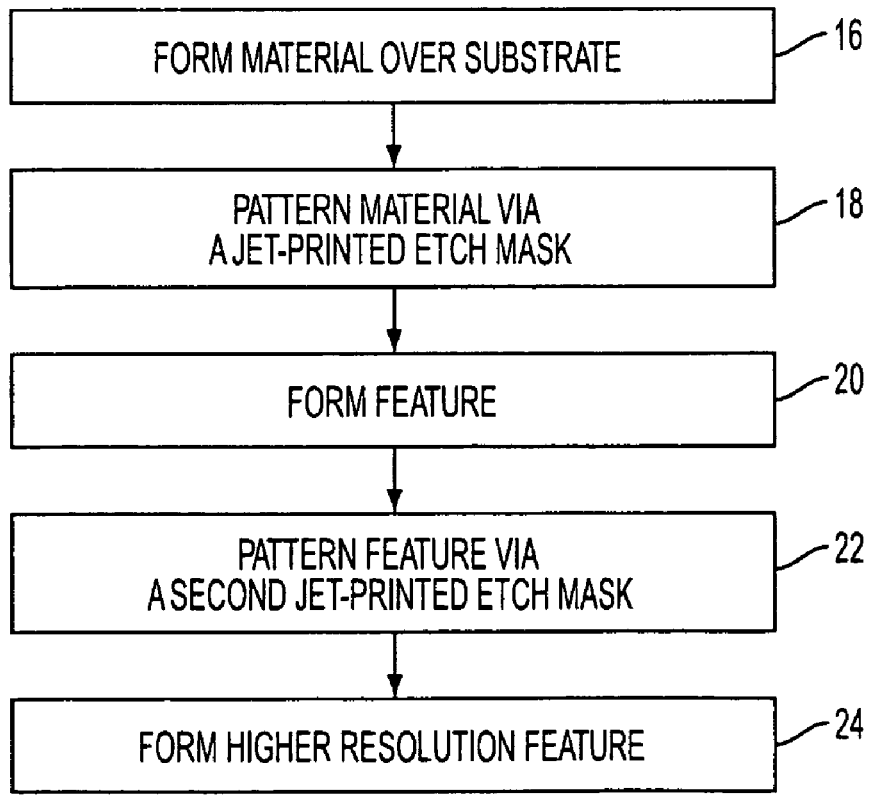
FIG. 2 illustrates an exemplary method for patterning fine features using multiple jet-printed etch masks in which a first mask is patterned and etched and then subsequent masks are patterned and etched.

FIG. 2 illustrates another method for patterning fine features using jet-printed etch masks. At 16, a material suitable for a feature, such as an electrode (e.g., for a transistor, etc.), is deposited on a substrate. In one instance, the material can be applied as a thin film or a layer and/or include a metal such as Aluminum. At 18, the feature is patterned on the material by forming a mask or the like. The mask can be applied through jet-printing to create a jet-printed etch mask. In addition, the mask can include a wax, a resist, and/or other suitable material. The pattern can be aligned using alignment marks and then jetted onto the material. At 20, a low-resolution feature is formed by etching the exposed material (the material not covered by the mask), and subsequently removing the mask. The exposed material can be dry etched (e.g., via a plasma) or wet etched via an acid (e.g., a sulfuric, phosphoric acid, etc.), solvent or base, laser etched, gas etched, etch via Microelectromechanical Systems (MEMS) technology, etc. The mask can be removed through stripping (e.g., via a solvent, an acid, a gas, a plasma, a laser, etc.). As noted above, the feature created through a single jet-printed etch mask with a conventional jet-printer typically is a low-resolution feature with a width of about forty microns or more.

At 22, a second mask is printed over a portion of the feature. The second mask is aligned using the alignment marks used to align the first pattern and/or a different set of alignment marks. In instances where the second pattern is used to reduce the width of the feature, the pattern is jetted over the feature and shifted over or offset from the position of the first mask, leaving a portion of the feature exposed. At 24, a higher resolution feature is formed. For example, an etch technique (e.g., as described herein and/or other techniques) can be used to remove the exposed portion of the feature. The mask can subsequently be removed through stripping (e.g., as described herein and/or other techniques). The resulting feature is narrower and higher in resolution than the feature formed via the first jet-printed etch mask described at 20.

Optionally, one or more additional jet-printed masks can be used in order to further re-shape the feature. In addition, the feature and/or the substrate can be further processed, for example, by creating other patterned features on the substrate.

Figure 3:
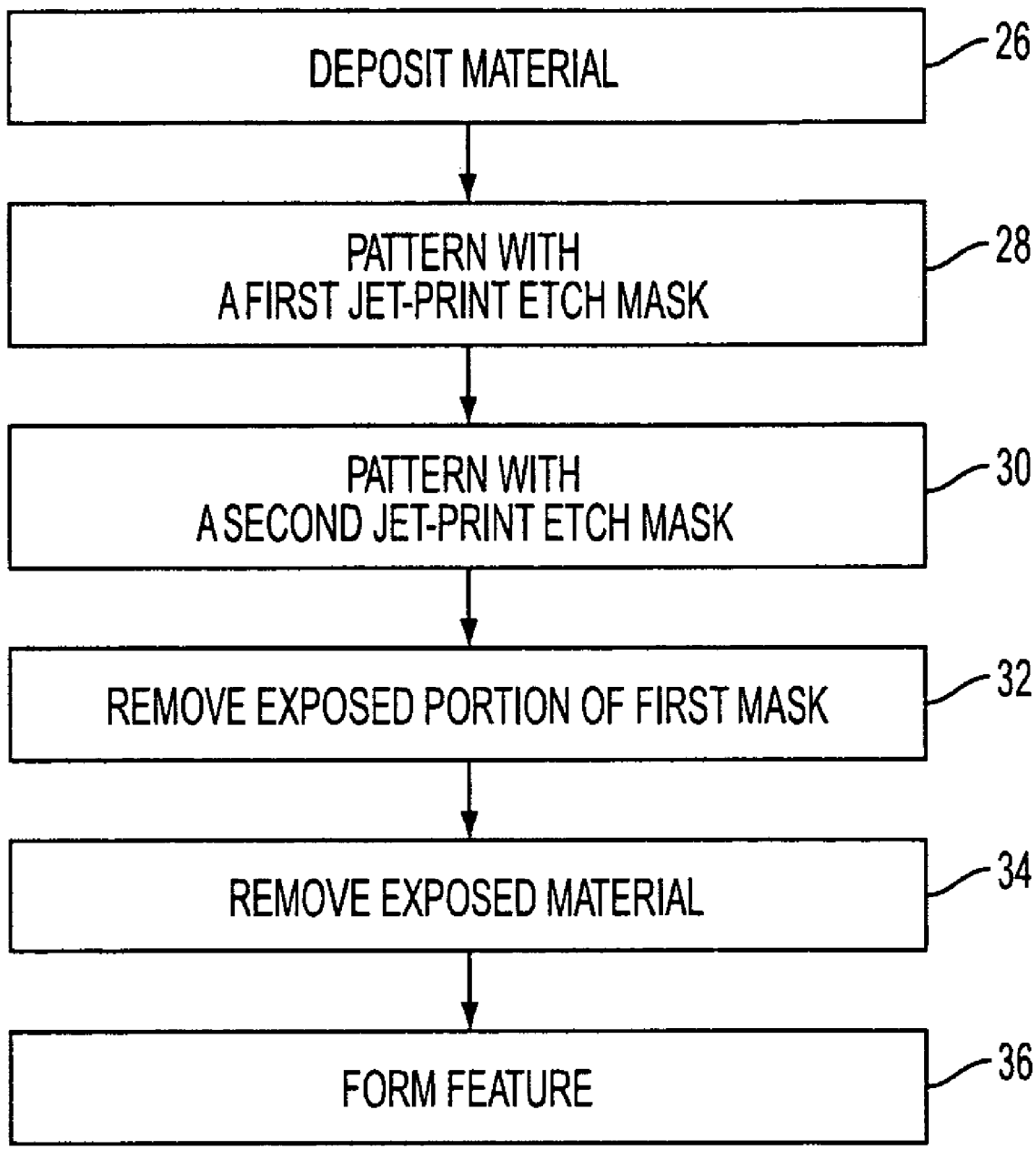
FIG. 3 illustrates an exemplary method for patterning fine features using multiple jet-printed etch masks in which the masks are patterned and then etched.

FIG. 3 illustrates another method for patterning fine features using multiple jet-printed etch masks. At reference numeral 26, a material such as a metalized thin film is deposited on a substrate. At 28, the material is patterned via a jet-printed etch mask. For instance, a mask can be printed and subsequently exposed material can be etched. At 30, a second mask is jet-printed over a portion of the first mask. As described above, drop placement typically is relatively accurate with jet-printing. Thus, the two masks can be accurately positioned with respect to each other to define a width of a final feature as the width of the overlapping portions of the mask. Such width can be less then forty microns (e.g., ten, twenty, etc. microns), which is relatively narrower than the width of the individual masks, which typically is about forty microns or greater for conventional jet-printers. The two masks can be aligned using similar or different alignment marks. At 32, the exposed portion of the first mask is removed using known stripping techniques. In order to facilitate removing only one mask at a time, the first and second masks can be formed from materials with different characteristics such that different stripping and/or etching techniques selectively remove the masks. At 34, the exposed material is then etched using known etching techniques. At 36, the feature if formed by removing the second mask, etching the exposed feature, and removing the remaining portion of the first mask.

Figure 4:
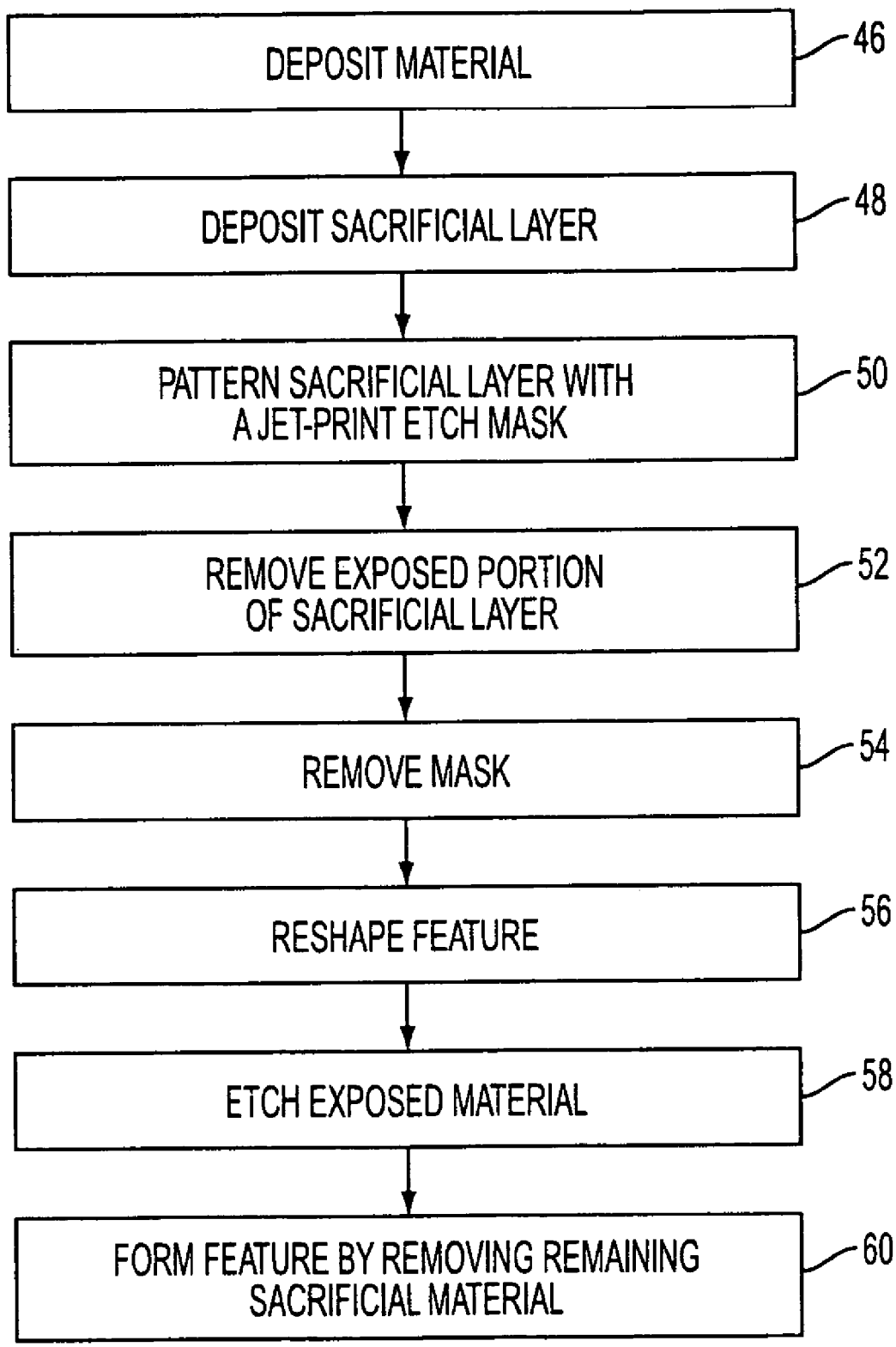
FIG. 4 illustrates an exemplary method for patterning fine features using a sacrificial layer and multiple jet-printed etch masks.

FIG. 4 illustrates another method for patterning fine features using a sacrificial layer and multiple jet-printed etch masks. At 46, a material that will be patterned to create one or more features is deposited on a substrate. At 48, a sacrificial layer is deposited over the material. The sacrificial layer can be a dielectric and/or include a metal such as aluminum. At 50, the sacrificial layer is patterned via a jet-printed mask. At 52, the exposed sacrificial material is etched. For instance, an acid can be used to etch the exposed sacrificial material. At 54, the mask is stripped, for example, via a solvent or the like. At 56, the one or more features are re-shaped by repeating the acts described through 50-54 one or more times. Suitable re-shaping includes narrowing the features to form features higher in resolution then the initial features. At 58, the exposed material is etched. At 60, the remaining sacrificial material is removed, leaving behind the one or more features.

Figure 5:
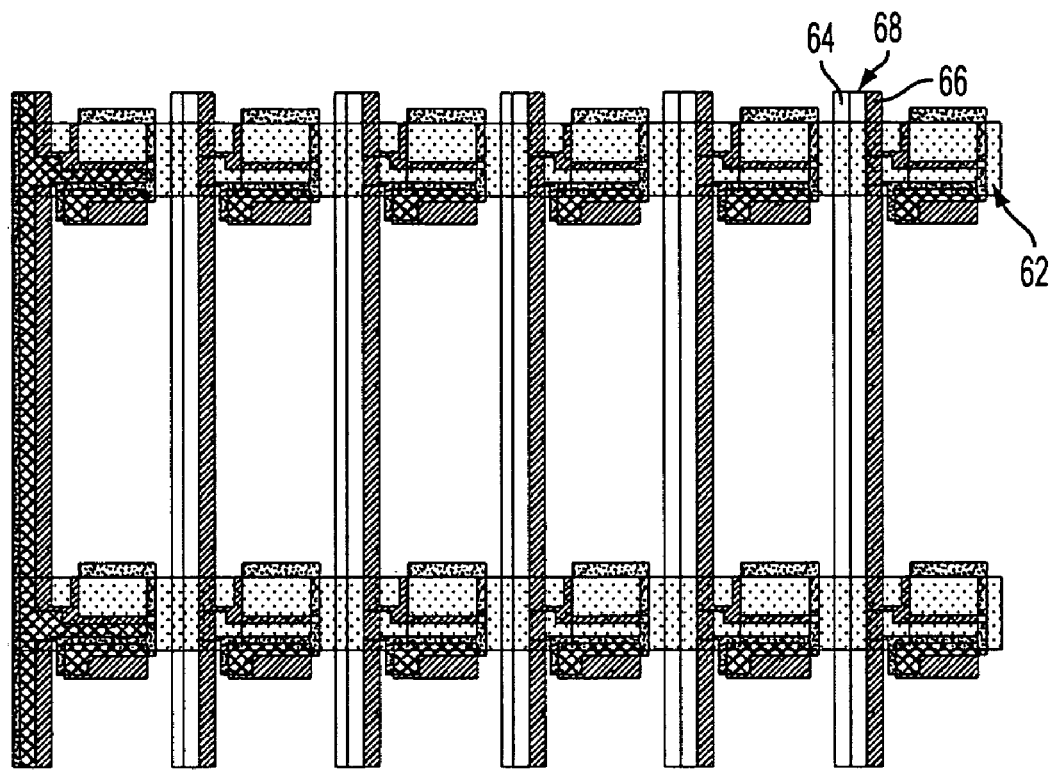
FIGS. 5 and 6 illustrate an example of a source-drain layer of a TFT for a display formed through the methods described herein.

FIG. 5 illustrates a non-limiting example of using the methods described herein for forming pixels for a display (e.g., flat panel, liquid crystal (LCD), etc.). It is to be appreciated that the multi-mask techniques may be used to reduce feature size and increase feature resolution in connection with one or more layers of a device. In one instance, the multi-mask technique is used to facilitate forming the source-drain electrodes layer in a thin film transistor (TFT) or the like. The resulting TFT is often smaller in size, associated with reduced overlap capacitance, and may include a greater display aperture ratio, relative to TFT's formed through single mask and/or other techniques.

Figure 6:
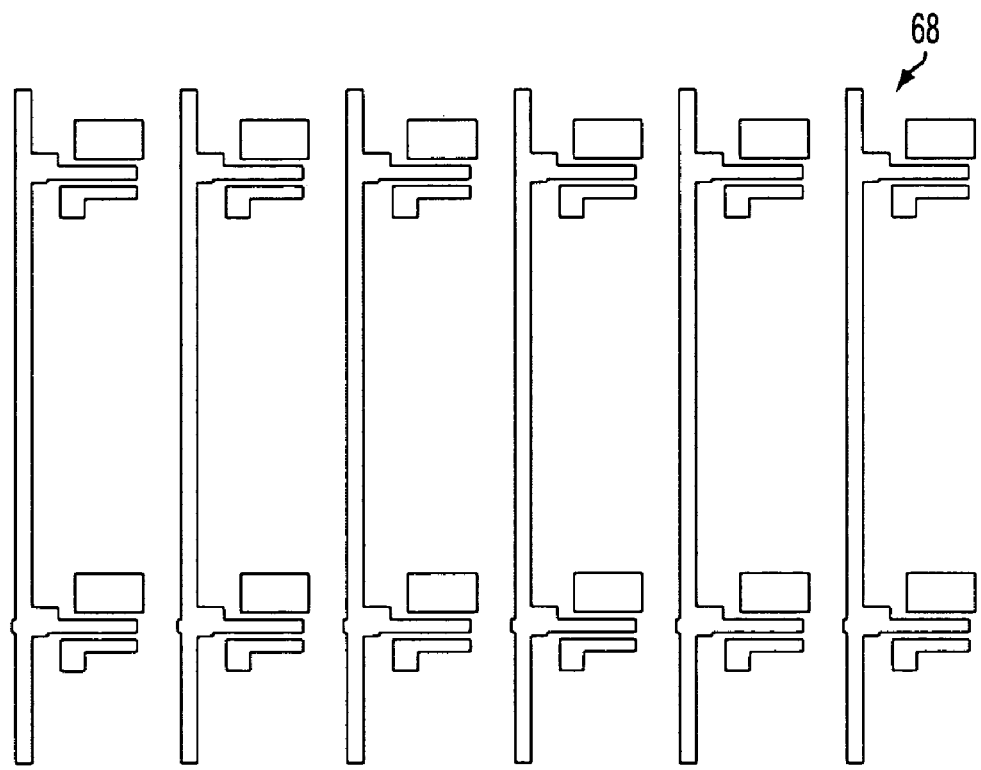

The example illustrates a gate metal mask at 62, which can be formed in a single mask process. Masks 64 and 66 are used to form the source-drain electrode. In one instance, the mask 64 is jet-printed over a material that will form the electrode. The exposed material is etched, and the mask 64 is stripped, rendering a feature. The mask 66 is jet-printed over the resulting feature such that it partially overlaps the resulting feature. The exposed feature is etched and the mask 66 is stripped, forming a finer feature 68 where the masks 58 and 60 overlapped. As described above this feature is narrower and higher in resolution then a feature formed through a single jet-printed etch mask. In another instance, the mask 66 is jet-printed and used to form the lower resolution feature. The mask 64 is then jet-printed over the material to partially overlap the resulting feature. The exposed feature is etched and the mask 64 is stripped, forming the feature 68 where the masks 64 and 66 overlapped. FIG. 6 illustrates the final feature 68.

This multi-mask patterning of source-drain layer can be performed substantially similar to the printing technique used for single mask layers. Alignment of the two patterns can be through known alignment marks. For instance, the alignment marks can be substantially similar to those used for a single mask digital lithography process. In addition, the alignment marks for subsequent masks can be printed by previous masks, formed on an underlying layer(s), and/or be alignment marks used with previous masks.

Figure 7:
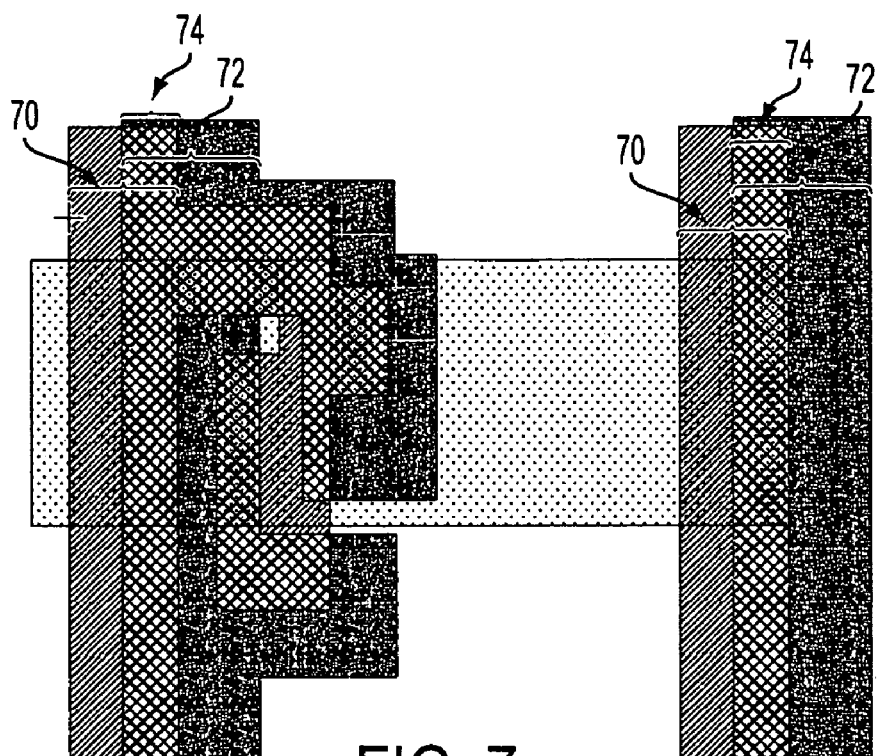
FIGS. 7 and 8 illustrate an example of a source-drain layer of a TFT array formed through the methods described herein.
Figure 8:
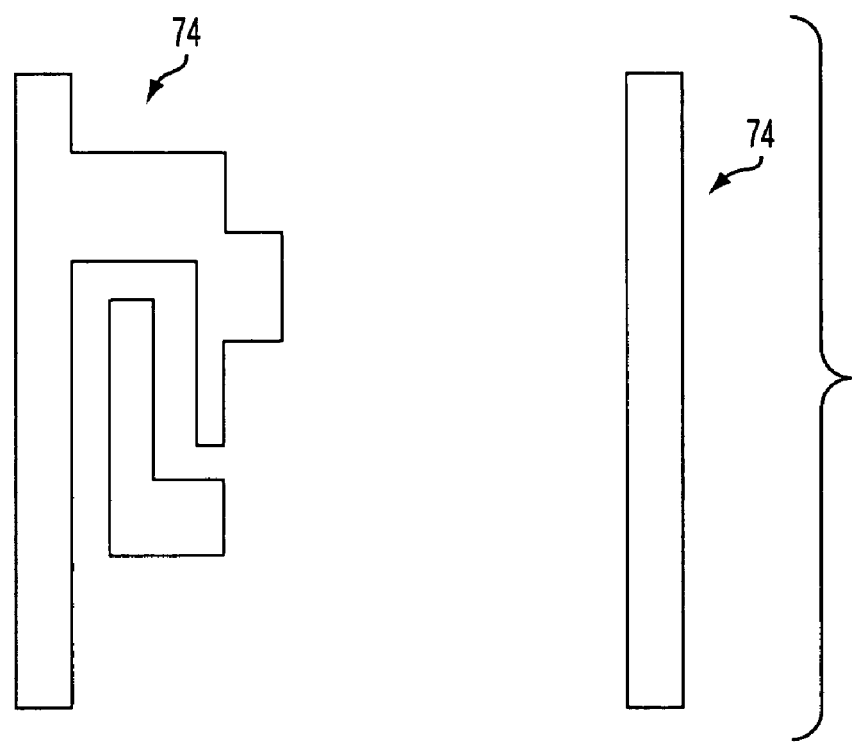

FIG. 7 illustrates a non-limiting example of using the methods described herein for forming a source-drain layer of a TFT array employing a "U" shaped transistor, such as those used with a polymer semiconductor. In such instances, the multiple jet-printed etch masks can facilitate formation of polymer semiconductors with a large width-to-length ratio. As depicted, a mask 70 and a mask 72 are patterned in an overlap configuration. Typically, the mask that was jet-printed first is used to form an initial feature. Subsequently, the later jet-printed mask is used to decrease a width of the feature. For instance, after jetting one of the masks, the exposed material is etched, and the mask is stripped, forming the initial feature. The other mask is then jet-printed over the initial feature such that it partially overlaps the initial feature. The exposed feature is etched and the mask is stripped, forming a finer feature 74. This feature is narrower and higher in resolution then the initial feature formed through a single jet-printed etch mask. FIG. 8 illustrates the feature 74.

The methods describe herein are illustrated through a series of acts; however, it is to be understood that in various instances, the illustrated acts can occur in a different order. In addition, in some instance, the one or more of the acts can concurrently occur with one or more other acts. Moreover, in some instance more or less acts can be employed.

It will be appreciated that various embodiments of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A method for patterning fine features using multiple jet-printed etch masks, comprising:
    forming an initial feature in a material by patterning a first jet-printed etch mask and etching exposed material; and
    re-shaping the initial feature by patterning at least one additional jet-printed etch mask and etching further exposed material.

2. The method as set forth in claim 1, wherein the initial feature is re-shaped to reduce a width of the initial feature and increase a resolution of the initial feature.

3. The method as set forth in claim 1, wherein a width of the initial feature is about forty microns or greater and a width of the re-shaped feature is less than forty microns.

4. The method as set forth in claim 1, wherein a width of the re-shaped feature is one of about twenty microns and about ten microns.

5. The method as set forth in claim 1, wherein the first jet-printed etch mask and the at least one additional jet-printed etch mask are patterned parallel, orthogonal, or angled with respect to each other.

6. The method as set forth in claim 1, further including:
    depositing a thin film on a substrate; and
    patterning the initial feature on the thin film.

7. The method as set forth in claim 1, wherein the initial feature is formed from a metalized layer.

8. The method as set forth in claim 1, further including aligning the first etch mask and the at least one additional jet-printed etch mask via substantially similar and different alignment marks.

9. The method as set forth in claim 1, further including forming alignment marks for the at least one additional jet-printed etch mask with the first jet-printed etch mask.

10. The method as set forth in claim 1, further including forming at least one of a protective layer and a reflective layer over the re-shape feature.

11. The method as set forth in claim 1, further including:
    jetting the at least one additional jet-printed etch mask to partially overlap the initial feature;
    etching the exposed portion of the initial feature; and
    stripping the at least one additional jet-printed etch mask to form the re-shaped feature.

12. The method as set forth in claim 11, further including using one of an acid, a solvent, a gas, a base, a laser, and a plasma to etch the exposed portion of the initial feature.

13. The method as set forth in claim 11, further including using Microelectromechanical Systems (MEMS) technology to etch the exposed portion of the initial feature.

14. A method for patterning fine features using multiple jet-printed etch masks, comprising:
    patterning a first jet-printed etch mask on a material;
    removing unmasked portions of the material;
    stripping the first jet-printed etch mask to pattern a low-resolution feature;
    patterning a second jet-printed etch mask over a portion of the low-resolution feature;
    removing unmasked portions of the low-resolution feature; and
    stripping the second jet-printed etch mask to form a high-resolution feature.

15. The method as set forth in claim 14, wherein a width of the high-resolution feature is less than forty microns in width.

16. The method as set forth in claim 14, further including depositing a sacrificial layer over the material prior to at least one of patterning the first jet-printed etch mask and the second jet-printed etch mask.

17. A method for patterning features of a thin film transistor (TFT) using multiple jet-printed etch masks, comprising:
    jet-printing a first mask on a material to pattern a low-resolution electrode of the TFT;
    etching unmasked portions of the material;
    removing the first mask to form the low-resolution electrode;
    jet-printing a second mask that overlaps a portion of the low-resolution electrode;
    etching unmasked portions of the low-resolution electrode; and
    removing the second mask to form a high-resolution electrode.

18. The method as set forth in claim 17, wherein the high-resolution electrode is a source-drain electrode and further including forming a gate mask through a single mask process.

19. The method as set forth in claim 17, wherein the TFT is associated with at least one of a smaller width, reduced overlap capacitance, and greater display aperture ratio relative to a TFT formed through single jet-printed etch mask.

20. The method as set forth in claim 17, wherein a line width of the high-resolution source-drain electrode is less than 20 microns.

* * * * *